US009251916B2

(12) United States Patent
Tekumalla et al.

(10) Patent No.: US 9,251,916 B2
(45) Date of Patent: Feb. 2, 2016

(54) INTEGRATED CLOCK ARCHITECTURE FOR IMPROVED TESTING

(71) Applicant: LSI Corporation, San Jose, CA (US)

(72) Inventors: Ramesh C. Tekumalla, Breinigsville, PA (US); Vijay Sharma, Bangalore (IN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 297 days.

(21) Appl. No.: 13/863,656

(22) Filed: Apr. 16, 2013

(65) Prior Publication Data

US 2014/0289550 A1    Sep. 25, 2014

Related U.S. Application Data

(60) Provisional application No. 61/804,803, filed on Mar. 25, 2013.

(51) Int. Cl.
*G06F 13/42* (2006.01)
*G11C 29/12* (2006.01)
*G06F 1/12* (2006.01)
*G01R 31/3185* (2006.01)
*G11C 29/32* (2006.01)

(52) U.S. Cl.
CPC .. *G11C 29/12015* (2013.01); *G01R 31/318552* (2013.01); *G06F 1/12* (2013.01); *G11C 2029/3202* (2013.01)

(58) Field of Classification Search
CPC .......................................................... G06F 1/12
USPC .......................................................... 713/401
See application file for complete search history.

(56) References Cited

U.S. PATENT DOCUMENTS

| 4,423,383 | A | * | 12/1983 | Svendsen ....................... 327/114 |
| 6,630,855 | B2 | * | 10/2003 | Fayneh et al. .................. 327/295 |
| 7,562,244 | B2 | | 7/2009 | Wielage |
| 7,900,108 | B2 | * | 3/2011 | Pugliesi-Conti et al. ..... 714/731 |
| 8,301,932 | B2 | * | 10/2012 | Hay et al. ....................... 713/400 |
| 2003/0033490 | A1 | * | 2/2003 | Gappisch et al. ............. 711/150 |
| 2011/0068820 | A1 | * | 3/2011 | Fox ................................. 326/16 |
| 2012/0139590 | A1 | * | 6/2012 | Myers et al. .................. 327/113 |
| 2012/0173943 | A1 | * | 7/2012 | Cesari ............................ 714/731 |

* cited by examiner

*Primary Examiner* — Thomas Lee
*Assistant Examiner* — Volvick Derose

(57) ABSTRACT

A computer system includes a first on-chip controller and a second on-chip controller, both connected to a control element. In normal operation, the first and second on-chip controllers operate in different clock domains. During testing, the control element causes each on-chip controller to generate a substantially similar clock signal. The substantially similar clock signals are used to test substantially similar test circuitry connected to each on-chip controller, thereby reducing overhead associated with testing. A delay may be incorporated into the path of the clock signal of one of the on-chip controllers to reduce instantaneous power draw during testing.

20 Claims, 10 Drawing Sheets

INTEGRATED CLOCK ARCHITECTURE FOR IMPROVED TESTING

PRIORITY

The present application claims the benefit under 35 U.S.C. §119(e) of U.S. Provisional Application Ser. No. 61/804,803, filed Mar. 25, 2013, which is incorporated herein by reference.

BACKGROUND OF THE INVENTION

On-chip-clock controllers are used in scan based designs to provide scan shift and capture clocks during scan testing. Generally, each clock domain has a separate on-chip controller. Where circuit functionality is essentially identical, testing separate clock domains adds overhead and increases the expense of testing by adding to the pattern count.

Consequently, it would be advantageous if an apparatus existed that is suitable for sharing logic across on-chip controllers to perform simultaneous captures.

SUMMARY OF THE INVENTION

Accordingly, the present invention is directed to a novel method and apparatus for sharing logic across on-chip controllers to perform simultaneous captures.

At least one embodiment of the present invention includes a first on-chip controller and a second on-chip controller, both connected to a control element. In normal operation, the first and second on-chip controllers operate in different clock domains. During testing, the control element causes each on-chip controller to generate a substantially similar clock signal. The substantially similar clock signals are used to test substantially similar test circuitry connected to each on-chip controller, thereby reducing overhead associated with testing. In another embodiment of the present invention, a delay is incorporated into the path of the clock signal of one of the on-chip controllers to reduce instantaneous power draw during testing.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
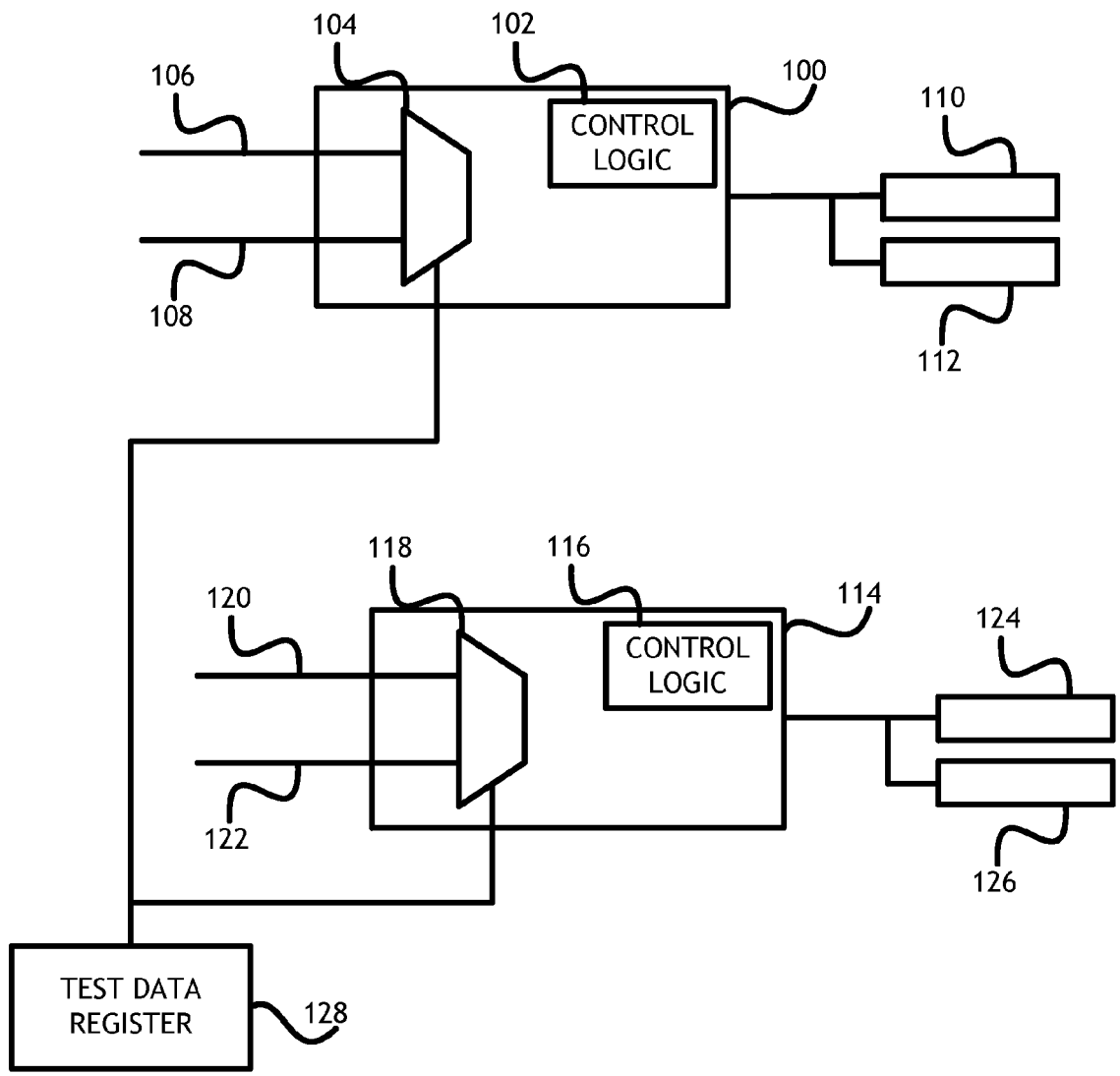
FIG. 1 shows a block diagram of two on-chip controllers configured for testing.

Referring to FIG. 1, a block diagram of two on-chip controllers configured for testing is shown. In a system, two on-chip controllers 100, 114 could have substantially similar operations. For example, in a test mode, a first on-chip controller 100 drives a signal for SCAN flip-flop circuitry 110 and memory built-in self-test circuitry 112. Likewise, a second on-chip controller 114 drives a signal for SCAN flip-flop circuitry 124 and memory built-in self-test circuitry 126. During normal operations, each of the on-chip controllers 100, 114 operates in a different clock domain (different clock frequency). The first on-chip controller 100 includes control logic circuitry 102 to drive test signals according to the clock domain of the first on-chip controller 100; likewise, the second on-chip controller 114 includes control logic circuitry 116 to drive test signals according to the clock domain of the second on-chip controller 114. Each of the on-chip controllers 100, 114 also includes a MUX 104, 118 to select a clock signal for each respective on-chip controller 100, 114. The first on-chip controller 100 MUX 104 selects either a first automated testing equipment clock signal 106 or a first functional clock signal 108 based on a value in a test data register 128. The second on-chip controller 114 MUX 118 selects either a second automated testing equipment clock signal 120 or a first functional clock signal 122 based on the value in the test data register 128.

In the system shown in FIG. 1, during testing each control logic circuit 102, 116 drives the associated on-chip controller 100, 114 according to a different clock domain defined by the operational clock domain of the circuit. However, where the functional circuitry is substantially similar (where the SCAN flip-flop circuitry 110 and memory built-in self-test circuitry 112 of the first on-chip controller 100 is identical to the SCAN flip-flop circuitry 124 and memory built-in self-test circuitry 126 of the second on-chip controller 114), testing could be conducted in a single clock domain.

Figure 2:
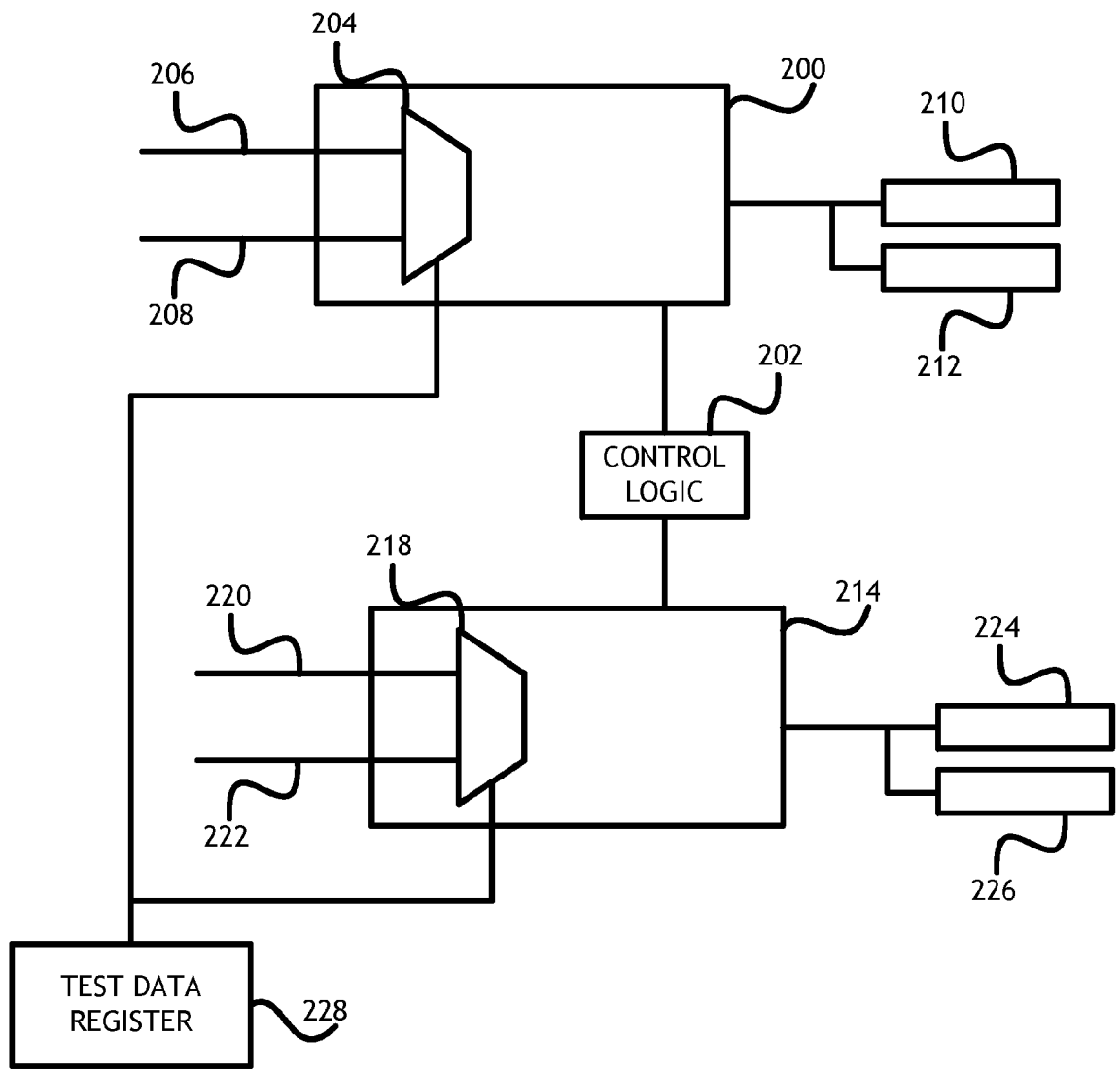
FIG. 2 shows a block diagram of two on-chip controllers connected by a single control logic circuit.

Referring to FIG. 2, a block diagram of two on-chip controllers connected by a single control logic circuit is shown. In at least one embodiment of the present invention, a system includes two on-chip controllers 200, 214. The two on-chip controllers 200, 214 drive circuitry having substantially similar operations. For example, in a test mode, a first on-chip controller 200 drives a signal for SCAN flip-flop circuitry 210 and memory built-in self-test circuitry 212. Likewise, a second on-chip controller 214 drives a signal for SCAN flip-flop circuitry 224 and memory built-in self-test circuitry 226. During normal operations, each of the on-chip controllers 200, 214 operates in a different clock domain (different clock frequency). Each of the first on-chip controller 200 and second on-chip controller 214 is connected to the same control logic circuitry 202 to drive test signals for each of the on-chip controllers 200, 214 in a single unified clock domain.

In at least one embodiment, each of the on-chip controllers 200, 214 also includes a MUX 204, 218 to select a clock signal for each respective on-chip controller 200, 214. The first on-chip controller 200 MUX 204 selects either a first automated testing equipment clock signal 206 or a first functional clock signal 208 based on a value in a test data register 228. The second on-chip controller 214 MUX 218 selects either a second automated testing equipment clock signal 220 or a first functional clock signal 222 based on the value in the test data register 228.

Operating all on-chip controllers 200, 214 simultaneously avoids serializing patterns that result in increased test time and test cost. In addition to situations where on-chip controllers 200, 214 operate in different clock domains, embodiments of the present invention are also useful where two similar memories are distantly placed because of constraints of a circuit floorplan, or where the number of compressor/decompressor chains necessitates a particular architecture.

Figure 3:
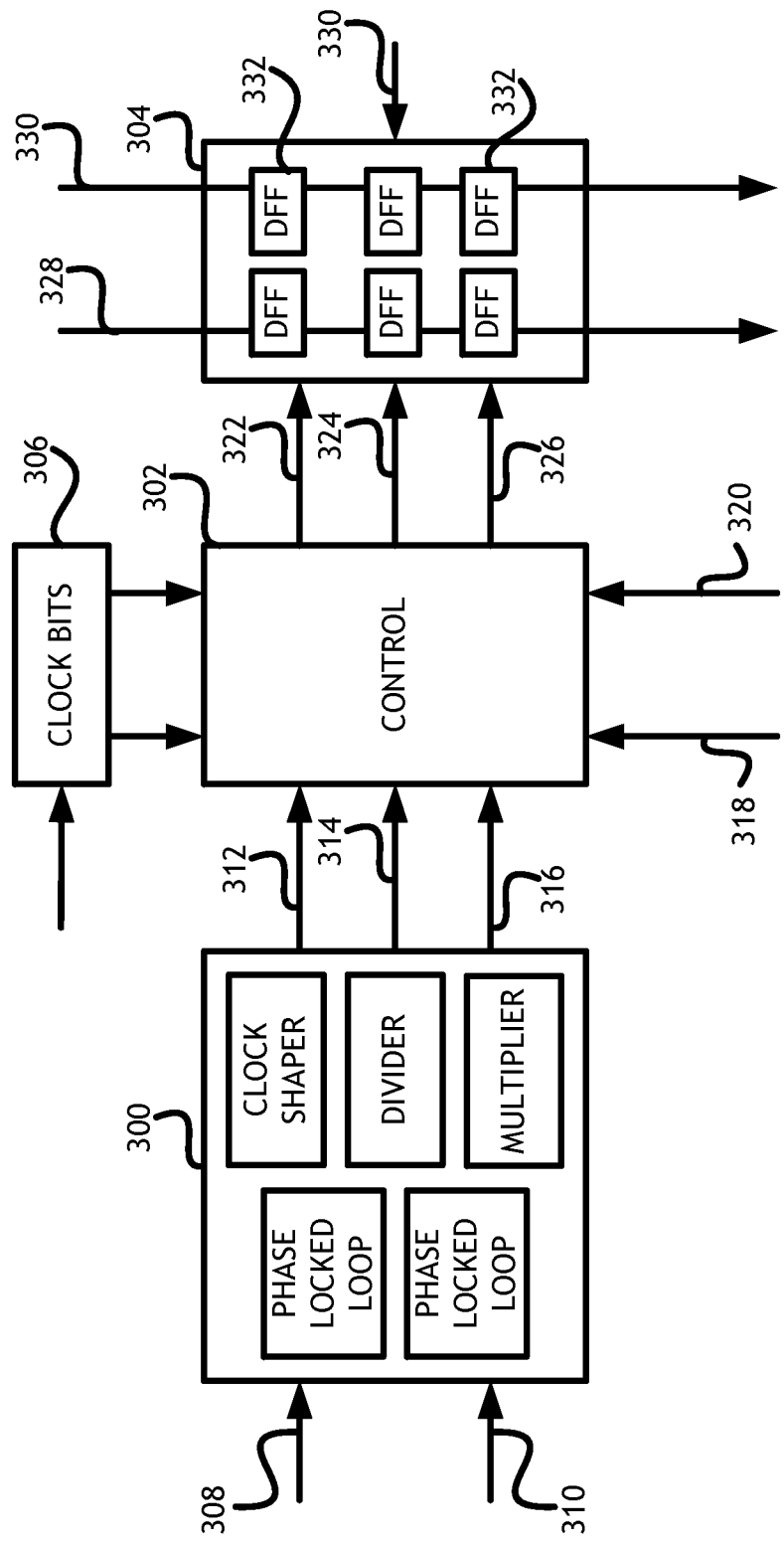
FIG. 3 shows a block diagram of an on-chip controller in a system-on-a-chip.

Referring to FIG. 3, a block diagram of an on-chip controller in a system-on-a-chip is shown. In at least one embodiment of the present invention, an on-chip controller in a system-on-a-chip includes an on-chip clock generator 300. The on-chip clock generator 300 receives a first reference clock 308 and a second reference clock 310. The on-chip clock generator 300 includes one or more phase locked loops, a clock shaper, a divider and a multiplier configured to produce one or more phase locked loop clocks 312, 314, 316. The one or more phased locked loop clocks 312, 314, 316 are received by an on-chip clock control element 302. The on-chip clock control element 302 receives one or more clock bits 306, a test signal 318 and an automated test equipment clock 320. Based on the one or more phase locked loop clocks 312, 314, 316, one or more clock bits 306, test signal 318 and automated test equipment clock 320, the on-chip clock control element 302 produces one or more internal clock signals 322, 324, 326.

In at least one embodiment, the one or more internal clock signals 322, 324, 326, and one or more external clock signals 330 are received by a logical block 304 having one or more D flip-flops 332. The one or more D flip-flops 332 are organized into one or more search chains 328, 330.

Figure 4:
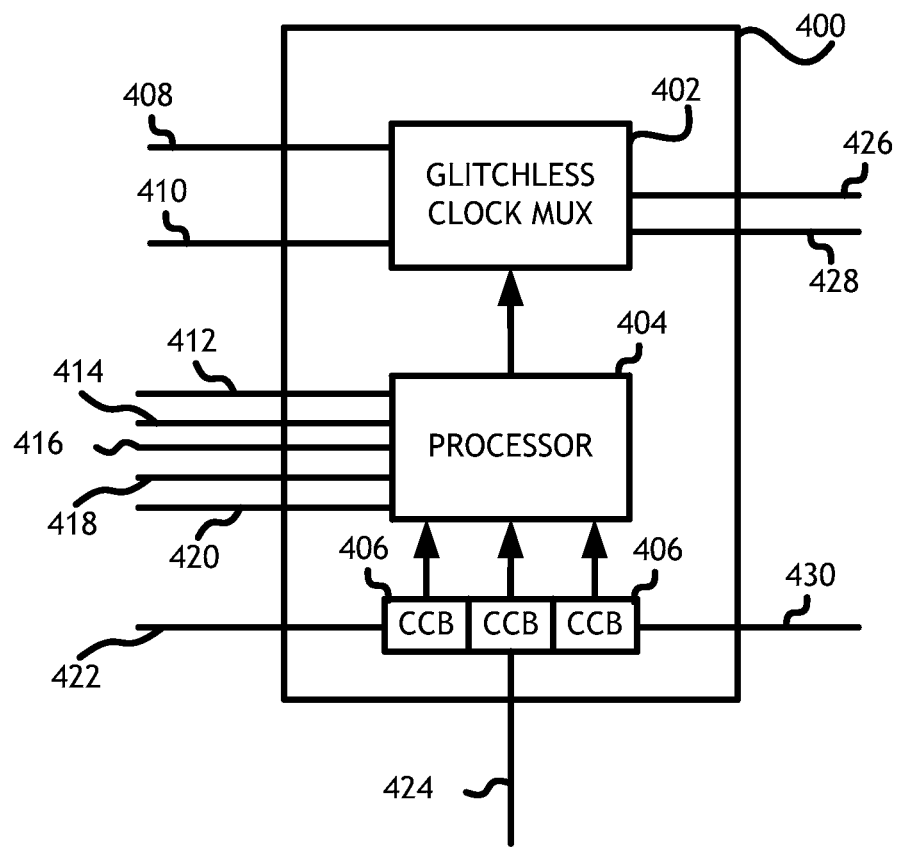
FIG. 4 shows a block diagram of an on-chip controller.

Referring to FIG. 4, a block diagram of an on-chip controller is shown. In at least one embodiment, an on-chip controller 400 includes a glitchless clock MUX 402, a processing element 404 and one or more channel control blocks 406. The one or more channel control blocks 406 receive an input channel control block signal 422 and a shift clock input 424. The one or more channel control blocks 406 produces an output channel control block signal 430. Output from each channel control block 406 is also sent to the processing element 404.

In at least one embodiment, the processing element 404 receives a scan mode input signal 412, a reference clock input signal 414, a phase locked loop input signal 416, a test input signal 418 and a memory built-in self-test mode signal 420. Based on the scan mode input signal 412, reference clock input signal 414, phase locked loop input signal 416, test input signal 418, memory built-in self-test mode signal 420 and signals from the one or more channel control blocks 406, the processing element 404 sends a MUX control signal to the glitchless clock MUX 402.

In at least one embodiment, the glitchless clock MUX 402 receives a phase locked loop clock signal 408 and a slow clock signal 410. Based on the MUX control signal from the processing element 404, the glitchless clock MUX 402 selects one of either the phase locked loop clock signal 408 and the slow clock signal 410, and outputs an internal clock signal 426 and an internal ram built-in self-test clock signal 428.

Figure 5:
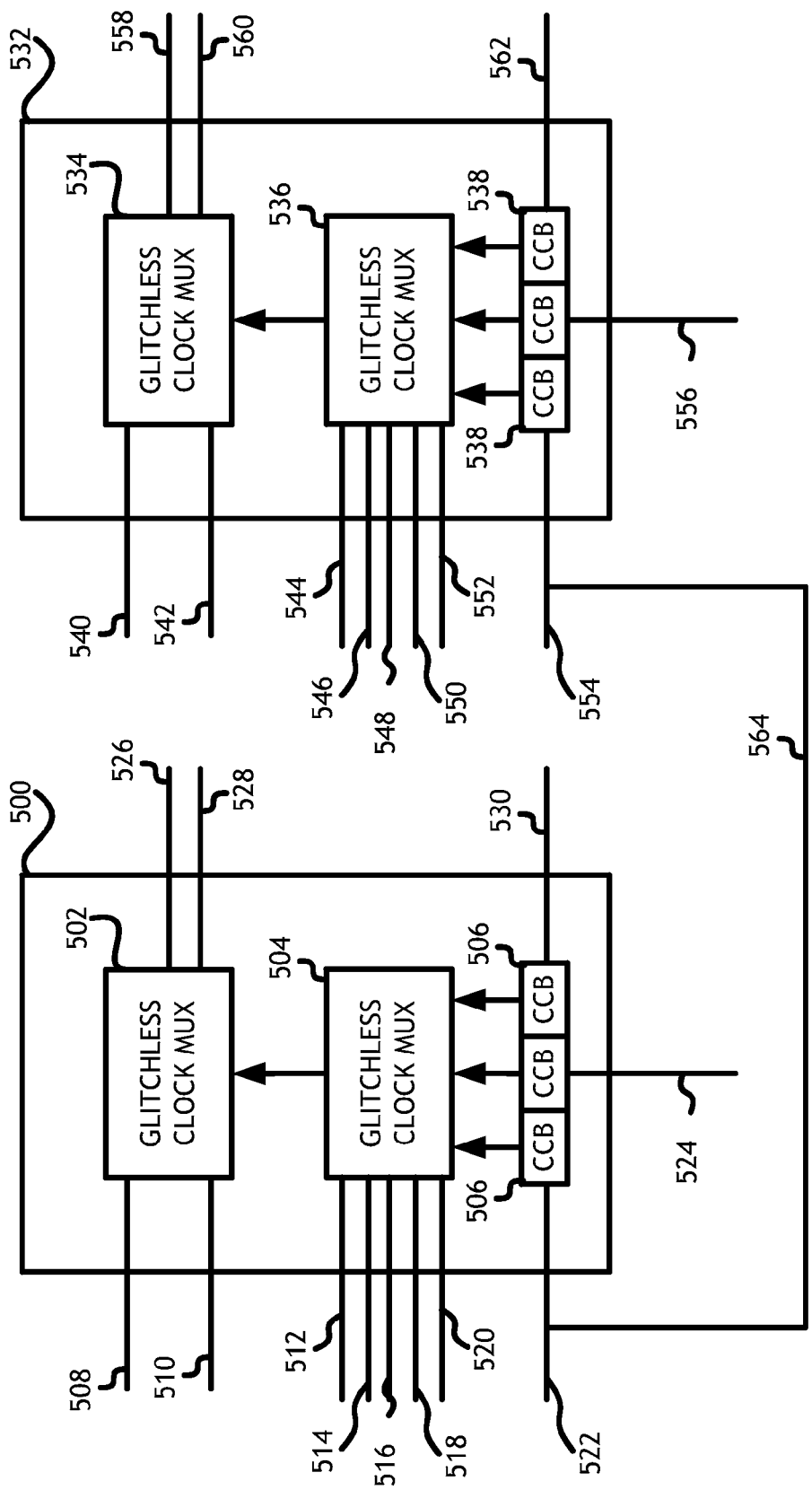
FIG. 5 shows a block diagram of two on-chip controllers configured to receive a single clock signal.

Referring to FIG. 5, a block diagram of two on-chip controllers configured to receive a single clock signal is shown. In at least one embodiment, a first on-chip controller 500 includes a glitchless clock MUX 502, a processing element 504 and one or more channel control blocks 506 that receive an input channel control block signal 522 and a shift clock input 524. The one or more channel control blocks 506 produce output signals sent to the processing element 504 and an output channel control block signal 530. The processing element 504 receives a scan mode input signal 512, a reference clock input signal 514, a phase locked loop input signal 516, a test input signal 518 and a memory built-in self-test mode signal 520 and uses those signals to send a MUX control signal to the glitchless clock MUX 502. The glitchless clock MUX 502 receives a phase locked loop clock signal 508 and a slow clock signal 510, and selects one of those signals based on the MUX control signal from the processing element 504. The glitchless clock MUX 502 outputs an internal clock signal 526 and an internal ram built-in self-test clock signal 528.

In at least one embodiment, a second on-chip controller 532 includes a glitchless clock MUX 534, a processing element 536 and one or more channel control blocks 538 that receive an input channel control block signal 554 and a shift clock input 556. The one or more channel control blocks 538 produce output signals sent to the processing element 536 and an output channel control block signal 562. The processing element 536 receives a scan mode input signal 544, a reference clock input signal 546, a phase locked loop input signal 548, a test input signal 550 and a memory built-in self-test mode signal 552 and uses those signals to send a MUX control signal to the glitchless clock MUX 534. The glitchless clock MUX 534 receives a phase locked loop clock signal 540 and a slow clock signal 542, and selects one of those signals based on the MUX control signal from the processing element 536. The glitchless clock MUX 534 outputs an internal clock signal 558 and an internal ram built-in self-test clock signal 560.

In at least one embodiment, the input channel control block signal 522 of the first on-chip controller 500 and the input channel control block signal 554 of the second on-chip controller 532 are controlled through a common connecting element 564 such that the input channel control block signals 522, 554 are identical and operating in the same clock domain. One skilled in the art may appreciate that other signals associated with the first on-chip controller 500 and the second on-chip controller 532 may be connected as necessary.

Figure 6:
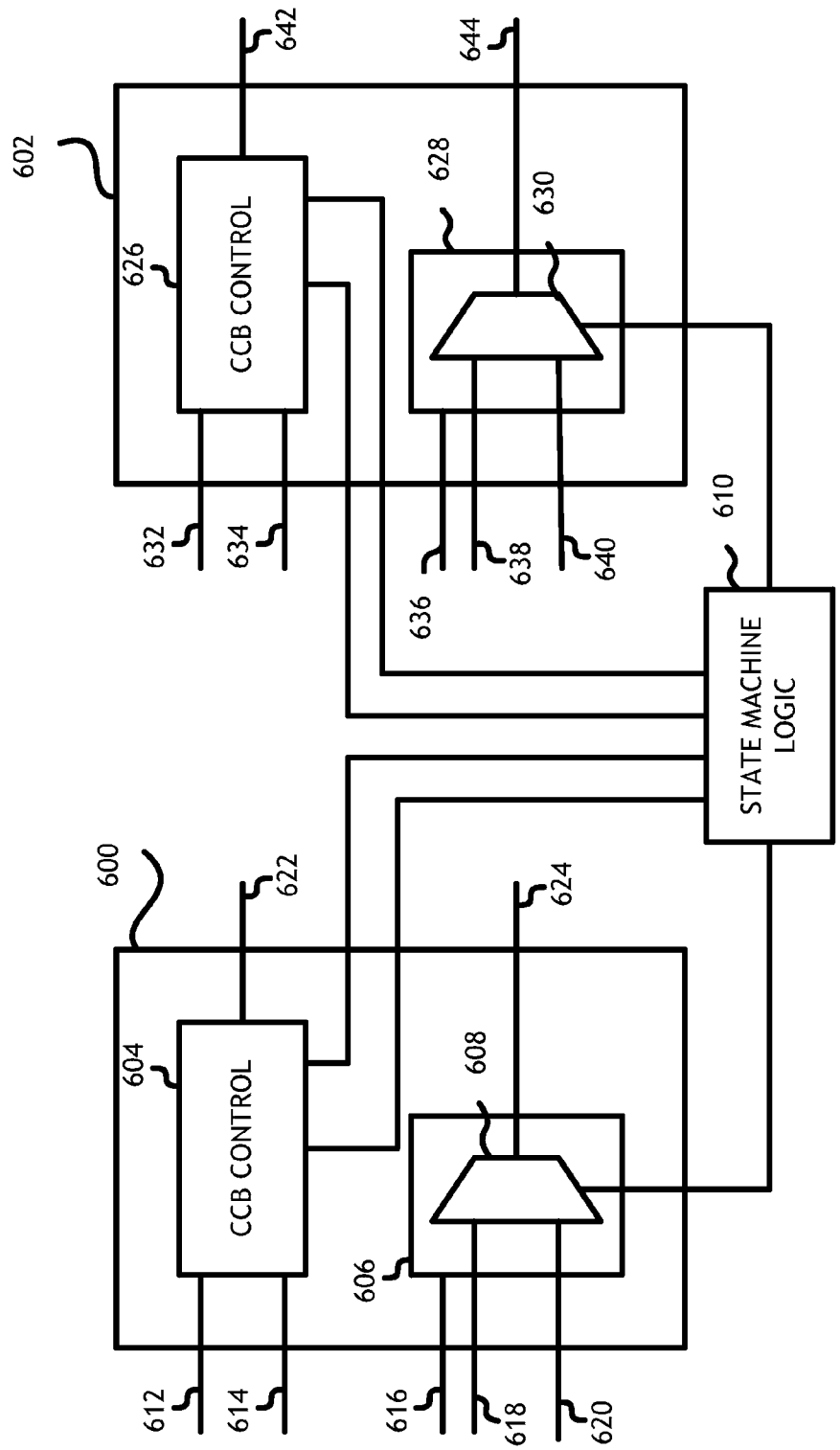
FIG. 6 shows a block diagram of two on-chip controllers connected by a common state machine logic.

Referring to FIG. 6, a block diagram of two on-chip controllers connected by a common state machine logic is shown. In at least one embodiment, a first on-chip controller 600 includes a channel control block controller 604 and a processing element 606 with a glitchless MUX 608. The channel control block controller 604 receives an on-chip control input signal 612 and an internal clock signal 614, and outputs an on-chip control output signal 622. The processing element 606 receives a test signal 616, and the glitchless MUX 608 receives an automated test equipment clock signal 618 and a phase locked loop clock signal 620 and outputs an internal clock signal 624 based on a signal from some state machine logic 610.

A second on-chip controller 602 includes a channel control block controller 626 and a processing element 628 with a glitchless MUX 630. The channel control block controller 626 receives an on-chip control input signal 632 and an internal clock signal 634, and outputs an on-chip control output signal 642. The processing element 628 receives a test signal 636, and the glitchless MUX 630 receives an automated test equipment clock signal 638 and a phase locked loop clock signal 640 and outputs an internal clock signal 644 based on a signal from the state machine logic 610.

In at least one embodiment, the state machine logic 610 further controls the channel control block controller 604 of the first on-chip controller 600 and the channel control block controller 626 of the second on-chip controller 602. The state machine logic 610 is a combined logical element driving the output of both on-chip controllers 600, 602 even where the on-chip controllers 600, 602 normally operate in separate clock domains.

Figure 7:
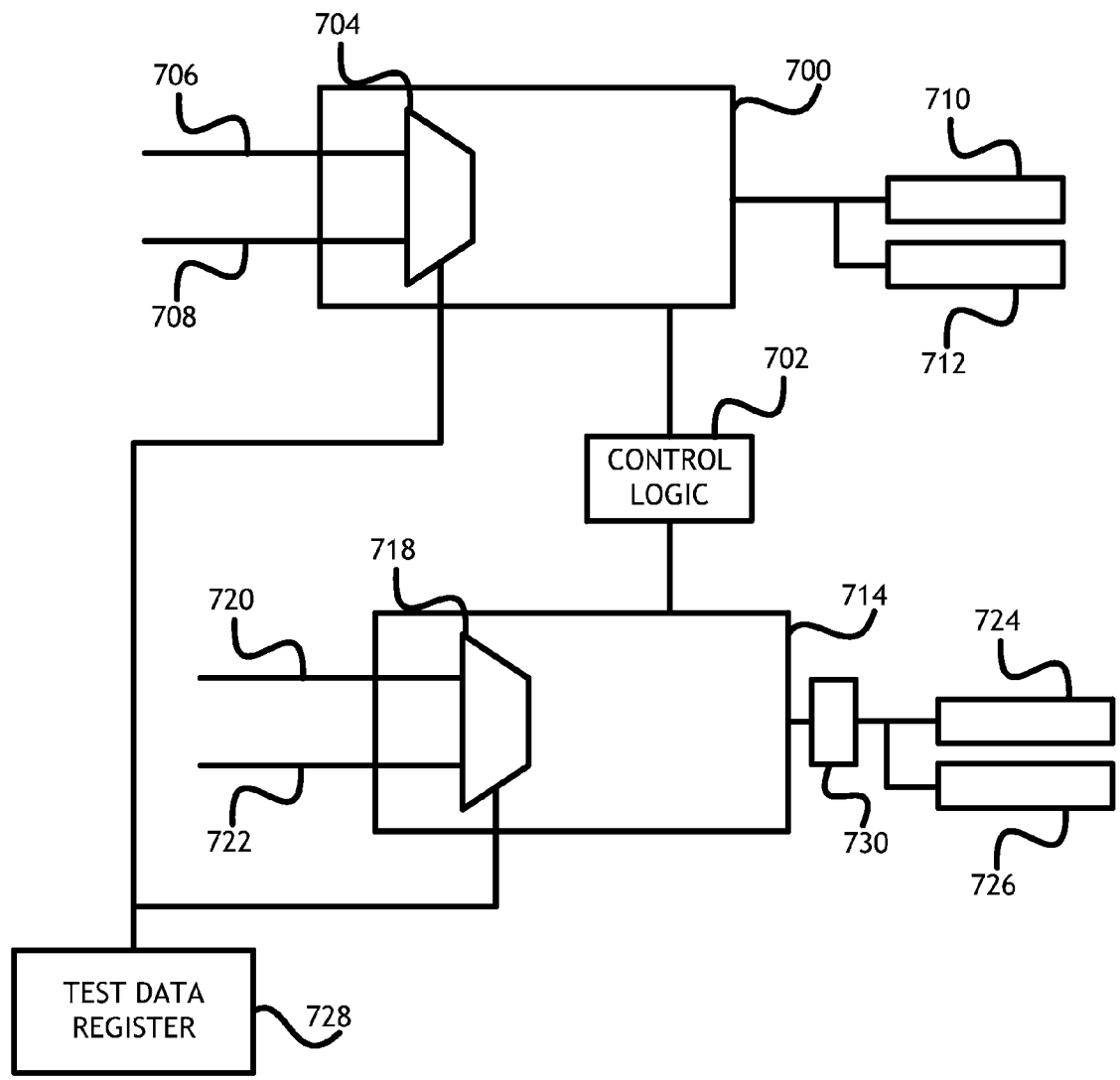
FIG. 7 shows a block diagram of two on-chip controllers connected by a single control logic circuit with a delay element.

Referring to FIG. 7, a block diagram of two on-chip controllers connected by a single control logic circuit with a delay element is shown. Operating multiple on-chip controllers simultaneously to drive substantially similar circuitry may produce an undesirable power draw at specific moments. In at least one embodiment, a delay element 730 delays a simultaneously driven clock signal by a predetermined amount, such as half a clock cycle.

In at least one embodiment of the present invention, a system includes two on-chip controllers 700, 714 that drive circuits with substantially similar operations. For example, in a test mode, a first on-chip controller 700 drives a signal for SCAN flip-flop circuitry 710 and memory built-in self-test circuitry 712. Likewise, a second on-chip controller 714 drives a signal, through a delay element 730, for SCAN flip-flop circuitry 724 and memory built-in self-test circuitry 726. During normal operations, each of the on-chip controllers 700, 714 operates in a different clock domain (different clock frequency). The delay element 730 delays the signal for some pre-defined duration. In at least one embodiment, the delay element 730 delays the signal for half of one clock cycle. Each of the first on-chip controller 700 and second on-chip controller 714 is connected to the same control logic circuitry 702 to drive test signals for each of the on-chip controllers 700, 714 in a single unified clock domain.

In at least one embodiment, each of the on-chip controllers 700, 714 also includes a MUX 704, 718 to select a clock signal for each respective on-chip controller 700, 714. The first on-chip controller 700 MUX 704 selects either a first automated testing equipment clock signal 706 or a first functional clock signal 708 based on a value in a test data register 728. The second on-chip controller 714 MUX 718 selects either a second automated testing equipment clock signal 720 or a first functional clock signal 722 based on the value in the test data register 728.

Figure 8:
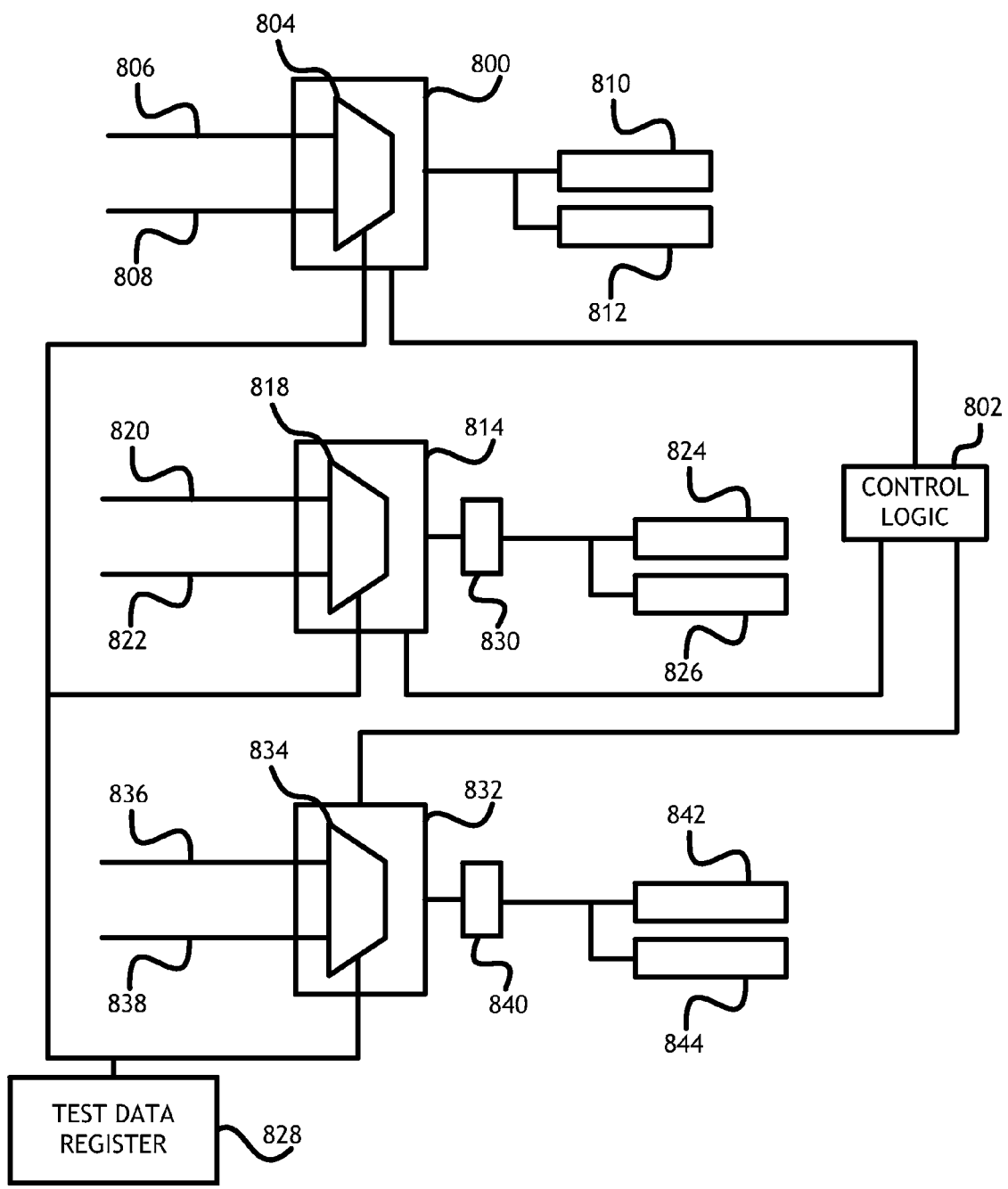
FIG. 8 shows a block diagram of three on-chip controllers connected by a single control logic circuit with multiple delay elements.

Referring to FIG. 8, a block diagram of three on-chip controllers connected by a single control logic circuit with multiple delay elements is shown. Operating multiple on-chip controllers simultaneously to drive substantially similar circuitry may produce an undesirable power draw at specific moments. In at least one embodiment, delay elements 830, 840 delay simultaneously driven clock signals by certain predetermined amounts.

In at least one embodiment of the present invention, a system includes three on-chip controllers 800, 814, 832 that drive circuits with substantially similar operations. For example, in a test mode, a first on-chip controller 800 drives a signal for SCAN flip-flop circuitry 810 and memory built-in self-test circuitry 812. Likewise, a second on-chip controller 814 drives a signal, through a first delay element 830, for SCAN flip-flop circuitry 824 and memory built-in self-test circuitry 826. Furthermore, a third on-chip controller 832 drives a signal, through a second delay element 840, for SCAN flip-flop circuitry 842 and memory built-in self-test circuitry 844. During normal operations, each of the on-chip controllers 800, 814, 832 operates in a different clock domain (different clock frequency). The first delay element 830 delays a clock signal for some pre-defined duration and the second delay element 840 delays a clock signal for some other pre-defined duration. In at least one embodiment, the first delay element 830 delays the signal for half of one clock cycle and the second delay element 840 delays the signal for a full clock cycle. Each of the first on-chip controller 800, second on-chip controller 814 and third on-chip controller 832 is connected to the same control logic circuitry 802 to drive test signals for each of the on-chip controllers 800, 814, 832 in a single unified clock domain.

In at least one embodiment, each of the on-chip controllers 800, 814, 832 also includes a MUX 804, 818, 834 to select a clock signal for each respective on-chip controller 800, 814, 832. The first on-chip controller 800 MUX 804 selects either a first automated testing equipment clock signal 806 or a first phase locked loop clock signal 808 based on a value in a test data register 828. The second on-chip controller 814 MUX 818 selects either a second automated testing equipment clock signal 820 or a second phase locked loop clock signal 822 based on the value in the test data register 828. And the third on-chip controller 832 MUX 834 selects either a third automated testing equipment clock signal 836 or a third phase locked loop clock signal 822 based on the value in the test data register 828. One skilled in the art may appreciate that the first, second and third automated testing equipment clock signals 806, 820, 836 may be identical. Likewise, one skilled in the art may appreciate that the first, second and third phase locked loop clock signals 808, 822, 838 may be identical.

Figure 9:
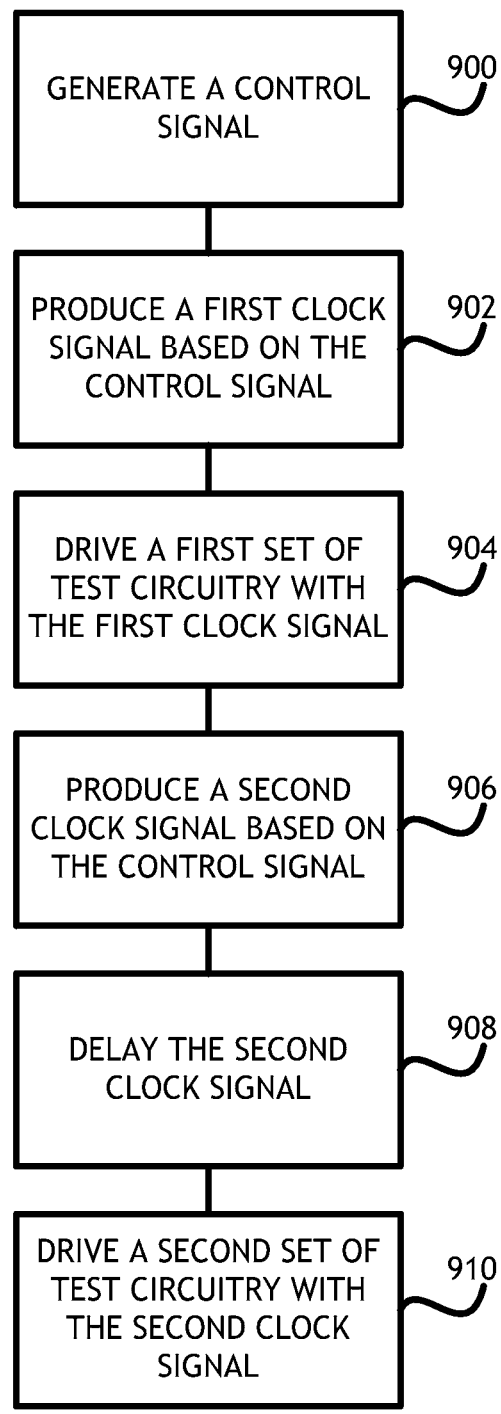
FIG. 9 shows a flowchart of a method for driving multiple on-chip controllers with a single control logic circuit.

Referring to FIG. 9, a flowchart of a method for driving multiple on-chip controllers with a single control logic circuit is shown. In at least one embodiment of the present invention, a control circuit generates 900 a control signal. The control signal is used by a first on-chip controller to produce 902 a first clock signal. The first clock signal drives 904 a first set of test circuitry.

While the first on-chip controller produces 902 the first clock signal, a second on-chip controller contemporaneously produces 906 a second clock signal. The second clock signal drives 910 a second set of test circuitry. In at least one embodiment, the second clock signal may be delayed 908 by a pre-determined duration before driving 910 the second set of test circuitry to limit power draw at any particular time.

Figure 10:
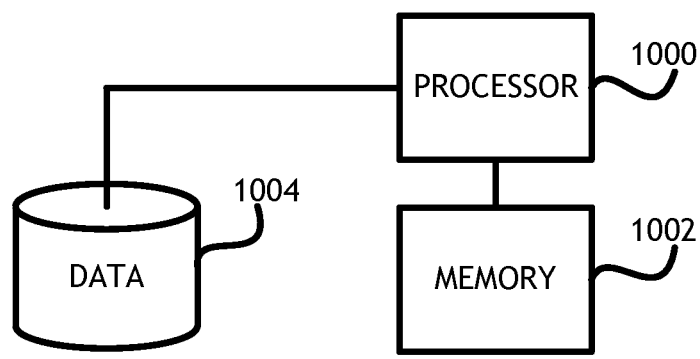
FIG. 10 shows a block diagram of a computer apparatus useful for implementing embodiments of the present invention.

Referring to FIG. 10, a block diagram of a computer apparatus useful for implementing embodiments of the present invention is shown. In at least one embodiment of the present invention, a computer apparatus includes a processor 1000, memory 1002 connected to the processor 1000 and a data store 1004 connected to the processor 1000. In at least one embodiment, the processor 1000 generates a control signal. The control signal is used by a first on-chip controller element of the processor 1000 to produce a first clock signal. The first clock signal drives a first set of test circuitry.

While the first on-chip controller of the processor 1000 produces the first clock signal, a second on-chip controller of the processor 10000 contemporaneously produces a second clock signal. The second clock signal drives a second set of test circuitry. In at least one embodiment, the processor 1000 may delay the second clock signal by a pre-determined duration before driving the second set of test circuitry to limit power draw at any particular time.

It is believed that the present invention and many of its attendant advantages will be understood by the foregoing description of embodiments of the present invention, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A memory storage system comprising:
    a first on-chip controller connected to a first test circuit, the first on-chip controller comprising at least one channel control block, the first on-chip controller configured to operate in a first clock domain;
    a second on-chip controller connected to a second test circuit, the second on-chip controller comprising at least one channel control block, the second on-chip controller configured to operate in a second clock domain; and
    control circuitry connected to the first on-chip controller and the second on-chip controller, wherein:
    the at least one channel control block of the first on-chip controller is configured to receive a first shift clock signal;
    the at least one channel control block of the second on-chip controller is configured to receive a second shift clock signal;
    the first on-chip controller is configured to produce a first clock signal based on a signal received from the control circuitry and the first shift clock signal;
    the second on-chip controller is configured to produce a second clock signal based on a signal received from the control circuitry and the second shift clock signal; and
    the first clock signal and second clock signal are substantially similar.

2. The memory storage system of claim 1, further comprising a delay element interposed between the second on-chip controller and the second test circuit, the delay element configured to delay the second clock signal.

3. The memory storage system of claim 2, wherein the delay element is configured to delay the second clock signal by half of one clock cycle.

4. The memory storage system of claim 3, further comprising:
    a third on-chip controller connected to a third test circuit, the third on-chip controller configured to operate in a third clock domain, connected to the control circuitry; and
    a second delay element interposed between the third on-chip controller and the third test circuit,
    wherein:
        the third on-chip controller is configured to produce a third clock signal based on a signal received form the control circuitry;
        the third clock signal is substantially similar to the first clock signal and the second clock signal; and
        the second delay element is configured to delay the third clock signal.

5. The memory storage system of claim 4, wherein the second delay element is configured to delay the third clock signal by one clock cycle.

6. The memory storage system of claim 1, further comprising a test data register connected to the first on-chip controller and the second on-chip controller, wherein the test data register is configured to supply test data to the first on-chip controller and the second on-chip controller.

7. A method for producing synchronous clock signals in two on-chip controllers comprising:
    generating a control signal;
    sending the control signal to a first on-chip controller and a second on-chip controller;
    receiving a first shift clock signal with at least one channel control block associated with the first on-chip controller;
    receiving a second shift clock signal with at least one channel control block associated with the second on-chip controller;
    producing a first clock signal based on the control signal and the first shift clock signal with the first on-chip controller; and
    producing a second clock signal based on the control signal and the second shift clock signal with the second on-chip controller, wherein:
    the first on-chip controller and the second on-chip controller are configured to operate in separate clock domains; and
    the first clock signal is substantially similar to the second clock signal.

8. The method of claim 7, further comprising delaying the second clock signal.

9. The method of claim 8, wherein the second clock signal is delayed by half of one clock cycle.

10. The method of claim 9, further comprising:
    sending the control signal to a third on-chip controller;
    producing a third clock signal based on the control signal with the third on-chip controller; and
    delaying the third clock signal,
    wherein the third clock signal is substantially similar to the first clock signal and the second clock signal.

11. The method of claim 10, wherein the third clock signal is delayed by one clock cycle.

12. The method of claim 7, supplying test data to the first on-chip controller and the second on-chip controller from a test data register.

13. A computer apparatus comprising: a processor comprising:
    a control element;
    a first on-chip controller configured to operate in a first clock domain, the first on-chip controller comprising at least one channel control block; and
    a second on-chip controller configured to operate in a second clock domain, the second on-chip controller comprising at least one channel control block;
    memory connected to the processor; and
    computer executable program code configured to execute on the processor, wherein:
    the at least one channel control block of the first on-chip controller is configured to receive a first shift clock signal;
    the at least one channel control block of the second on-chip controller is configured to receive a second shift clock signal;
    the computer executable program code is configured to:
    generate a control signal with the control element;
    send the control signal to the first on-chip controller and the second on-chip controller;
    produce a first clock signal based on the control signal and the first shift clock signal with the first on-chip controller; and
    produce a second clock signal based on the control signal and the second shift clock signal with the second on-chip controller; and the first clock signal is substantially similar to the second clock signal.

14. The computer apparatus of claim 13, further comprising:
   a first set of test circuitry connected to the first on-chip controller; and
   a second set of test circuitry connected to the second on-chip controller,
   wherein the first set of test circuitry is substantially similar to the second set of test circuitry.

15. The computer apparatus of claim 13, wherein the computer executable program code is further configured to delay the second clock signal.

16. The computer apparatus of claim 14, wherein the computer executable program code is configured to delay the second clock signal by half of one clock cycle.

17. The computer apparatus of claim 16, wherein the processor further comprises a third on-chip controller configured to operate in a third clock domain,
   wherein:
      the computer executable program code is further configured to:
         send the control signal to the third on-chip controller;
         produce a third clock signal based on the control signal with the third on-chip controller; and
         delay the third clock signal; and
      the third clock signal is substantially similar to the first clock signal and the second clock signal.

18. The computer apparatus of claim 17, wherein the computer executable program code is configured to delay the third clock signal by one clock cycle.

19. The computer apparatus of claim 17, further comprising:
   a first set of test circuitry connected to the first on-chip controller;
   a second set of test circuitry connected to the second on-chip controller; and
   a third set of test circuitry connected to the third on-chip controller;
   wherein the first set of test circuitry, second set of test circuitry and third set of test circuitry are substantially similar.

20. The computer apparatus of claim 13, wherein the memory comprises a test data register configured to supply test data to the first on-chip controller and the second on-chip controller.

* * * * *